US012684843B2

(12) United States Patent
Noh

(10) Patent No.: US 12,684,843 B2
(45) Date of Patent: Jul. 14, 2026

(54) III-N SEMICONDUCTOR STRUCTURE AND METHOD OF MANUFACTURING SAME

(71) Applicant: IVWorks Co., Ltd., Daejeon (KR)

(72) Inventor: Young Kyun Noh, Daejeon (KR)

(73) Assignee: IVWorks Co., Ltd., Daejeon (KR)

( * ) Notice: Subject to any disclaimer, the term of this patent is extended or adjusted under 35 U.S.C. 154(b) by 434 days.

(21) Appl. No.: 17/517,352

(22) Filed: Nov. 2, 2021

(65) Prior Publication Data

US 2022/0384580 A1      Dec. 1, 2022

(30) Foreign Application Priority Data

May 28, 2021      (KR) ......................... 10-2021-0069096

(51) Int. Cl.
| | |
|---|---|
| *H10D 62/815* | (2025.01) |
| *H10D 62/824* | (2025.01) |
| *H10D 62/85* | (2025.01) |
| *H10P 14/20* | (2026.01) |

(52) U.S. Cl.
CPC ....... *H10D 62/8164* (2025.01); *H10D 62/824* (2025.01); *H10D 62/8503* (2025.01); *H10P 14/2905* (2026.01); *H10P 14/3216* (2026.01); *H10P 14/3416* (2026.01)

(58) Field of Classification Search
None
See application file for complete search history.

(56) References Cited

U.S. PATENT DOCUMENTS

| | | | |
|---|---|---|---|
| 11,367,706 B2 | 6/2022 | Chiu | |
| 2006/0118824 A1* | 6/2006 | Otsuka | ................ H01L 29/7787 |
| | | | 257/E29.253 |
| 2012/0280244 A1 | 11/2012 | Hwang et al. | |

(Continued)

FOREIGN PATENT DOCUMENTS

| | | |
|---|---|---|
| CN | 111490100 A | 8/2020 |
| EP | 1 710 831 A1 | 10/2006 |

(Continued)

OTHER PUBLICATIONS

Taiwanese Office Action in Appl. Ser. No. 110140621 dated Aug. 31, 2022 (16 pages).

(Continued)

*Primary Examiner* — Sue A Purvis
*Assistant Examiner* — Seyon Ali-Simah Punchbeddell
(74) *Attorney, Agent, or Firm* — Foley & Lardner LLP

(57) ABSTRACT

Disclosed herein are a III-N semiconductor structure manufactured by growing a III-N material on a superlattice structure layer, formed of AlGaN and InAlN materials, which serves as a buffer layer, and a method for manufacturing the same. The disclosed III-N semiconductor structure includes: a substrate including a silicon material; a seed layer formed on the substrate and including an aluminum nitride (AlN) material; a superlattice structure layer formed by sequentially depositing a plurality of superlattice units on the seed layer; and a cap layer formed on the superlattice structure layer and including a gallium nitride (GaN) material, wherein the superlattice units are each composed of a first layer including an $Al_xGa_{1-x}N$ wherein $0 \leq x \leq 1$ and a second layer including an $In_yAl_{1-y}N$ wherein $0 < y \leq 0.4$.

8 Claims, 3 Drawing Sheets

100

(56)     References Cited

U.S. PATENT DOCUMENTS

2013/0334495  A1      12/2013  Lim et al.
2015/0187924  A1       7/2015  Dasgupta et al.
2016/0359004  A1 *    12/2016  Su ...................... H01L 21/0254
2019/0214468  A1 *     7/2019  Weeks, Jr.  ............ C30B 25/183

FOREIGN PATENT DOCUMENTS

| | | | |
|---|---|---|---|
| JP | 2007-250991 | A | 9/2007 |
| JP | 2016-167472 | A | 9/2016 |
| KR | 10-2006-0027040 | A | 3/2006 |
| KR | 10-2012-0125041 | A | 11/2012 |
| KR | 10-2016-0101897 | A | 8/2016 |
| KR | 10-2017-0016544 | A | 2/2017 |
| TW | I727773 | B | 5/2021 |
| WO | WO-2007103419 | A2 * | 9/2007  ............. B82Y 20/00 |

OTHER PUBLICATIONS

Office Action issued in corresponding Japanese Patent Application No. 2021-184364, dated Apr. 25, 2023 (8 pages).
Office Action issued in corresponding Korean Patent Application No. 10-2021-0069096 dated Jun. 7, 2023 (6 pages).
European Office Action for EP Application No. 21210900.3 dated May 6, 2022.
Alam et al., "Bandgap and refractive index estimates of InAlN and related nitrides across their full composition ranges," Scientific Reports, 2020, vol. 10 (pp. 1-9).
Cramer et al., "Band gap bowing for high In content InAlN films," Journal of Applied Physics, 2019, vol. 126 (pp. 1-6).
European Official Communication for EP Appl. Ser. No. 21210900.3 dated Mar. 13, 2025 (7 pages).

* cited by examiner

III-N SEMICONDUCTOR STRUCTURE AND METHOD OF MANUFACTURING SAME

CROSS-REFERENCE TO RELATED APPLICATIONS

This application is based upon and claims the benefit of priority from Korean Patent Application No. 10-2021-0069096, filed on May 28, 2021, the entire contents of which are incorporated herein by reference.

TECHNICAL FIELD

The present disclosure relates to a III-N semiconductor structure which is formed by growing a III-N material on a superlattice structure layer serving as a buffer layer, and a manufacturing method therefor.

BACKGROUND

III-N materials, such as gallium nitride (GaN), etc., are necessary for fabrication of high-level semiconductor devices. GaN and compounds thereof are promising wide band-gap semiconductor materials suitable for use in the field of optoelectronic devices including blue light and ultraviolet light emitting diodes, and laser diodes and in the field of electronic devices including high frequency/high power devices such as RF transistors and power transistors.

As a base substrate for growing III-N materials such as gallium nitride (GaN), etc., a silicon (Si) substrate is economically favorable and promising for the growth of gallium nitride layers. Silicon substrates are inexpensive and have the advantage of excellent electrical and thermal conductivity as well as being available in a larger size. However, differences between gallium nitride and silicon in terms of lattice constants and heat expansion coefficients may become a serious problem, which can interfere with successful growth of an epitaxial layer.

To solve such problems, a superlattice structure layer composed of a combination of Al, Ga, and N is formed over a silicon substrate having an aluminum nitride (AlN) seed layer formed thereon, whereby strain can be controlled between a lower layer (silicon substrate or aluminum nitride seed layer) and an upper layer (gallium nitride layer). Strain may be controlled by reciprocally adjusting compositions and thickness ratios of Al and Ga in each layer of the superlattice structure layer, which is a buffer layer, to form an average lattice constant. The average lattice constant in buffer layers may be determined considering lattice constants of the lower and the upper layers so that bending or cracking in the semiconductor structure can be controlled when the growth of all epitaxial layers is finished.

However, when an average lattice constant in superlattice structure buffer layers composed of Al, Ga, and N is set in light of the differences in lattice constants between the lower and the upper layers, continuity of the lattice constants may be taken into account. If the upper layer is composed of gallium nitride, the average lattice constant should become close to the lattice constant of gallium nitride. In order for the average lattice constant to approach near the lattice constant of gallium nitride, the superlattice unit of the AlGaN/AlN buffer layers composed of Al, Ga, and N is required to have a decreased Al composition in the AlGaN layer or an increased thickness of the AlGaN layer, such that the average band gap is narrowed, with the consequent decrease of insulation properties.

2

SUMMARY

Provided are a III-N semiconductor structure capable of controlling a strain generated upon epitaxial growth of III-N materials on a heterogeneous substrate while maintaining a high bandgap, and a manufacturing method therefor.

A III-N semiconductor structure according to an embodiment of the present disclosure may include: a substrate including a silicon material; a seed layer formed on the substrate and including an aluminum nitride (AlN) material; a superlattice structure layer formed by sequentially depositing a plurality of superlattice units on the seed layer; and a cap layer formed on the superlattice structure layer and including a gallium nitride (GaN) material, wherein the superlattice units are each composed of a first layer including an $Al_xGa_{1-x}N$ wherein $0 \leq x \leq 1$ and a second layer including an $In_yAl_{1-y}N$ wherein $0 < y \leq 0.4$.

The superlattice units may each have a thickness of 30 nm or less.

The superlattice structure layer may have an average lattice constant between a lattice constant of the seed layer and a lattice constant of the cap layer.

The plurality of superlattice units sequentially deposited on the seed layer may be configured so that a superlattice unit deposited farther from the seed layer has a larger lattice constant.

The superlattice structure layer may be larger in bandgap energy than the cap layer.

The superlattice structure layer may include 50 or more superlattice units.

In the superlattice unit, a thickness ratio of the second layer to the first layer may range from 1:10 to 10:1.

The seed layer, the superlattice structure layer, and the cap layer may be grown by molecular beam epitaxy (MBE) or metal organic chemical vapor deposition (MOCVD).

A method for manufacturing a III-N semiconductor structure according to an embodiment of the present disclosure includes the steps of: preparing a substrate including a silicon material; forming a seed layer including an aluminum nitride (AlN) material on the substrate; forming a superlattice structure layer in which a plurality of superlattice units are sequentially deposited on the seed layer; and growing a gallium nitride (GaN) material on the superlattice structure layer to form a cap layer, wherein the superlattice units are each composed of a first layer including an $Al_xGa_{1-x}N$ wherein $0 \leq x \leq 1$ and a second layer including an $In_yAl_{1-y}N$ wherein $0 < y \leq 0.4$.

The step of forming a superlattice structure layer may be conducted so as to make each of the superlattice units 30 nm or less in thickness.

The step of forming a superlattice structure layer may be conducted so that the superlattice structure layer is controlled to have an average lattice constant between a lattice constant of the seed layer and a lattice constant of the cap layer.

The step of forming a superlattice structure layer may be conducted so that a superlattice unit deposited farther from the seed layer is controlled to have a larger lattice constant.

The step of forming a superlattice structure layer may be conducted so that the superlattice structure layer is controlled to have a bandgap energy larger than that of the cap layer.

The step of forming a superlattice structure layer may be conducted so that the superlattice structure layer is controlled to include at least 50 superlattice units.

The step of forming a superlattice structure layer may be conducted so that a thickness ratio of the second layer to the first layer in the superlattice unit ranges from 1:10 to 10:1.

The seed layer, the superlattice structure layer, and the cap layer may be grown by molecular beam epitaxy (MBE) or metal organic chemical vapor deposition (MOCVD).

BRIEF DESCRIPTION OF DRAWINGS

The accompanying drawings, which are incorporated in and constitute a part of the specification, illustrate embodiments of the present disclosure.

FIG. 4 is a graph showing correlation between lattice constant and band gap in III-N semiconductor materials.

DETAILED DESCRIPTION

Figure 1:
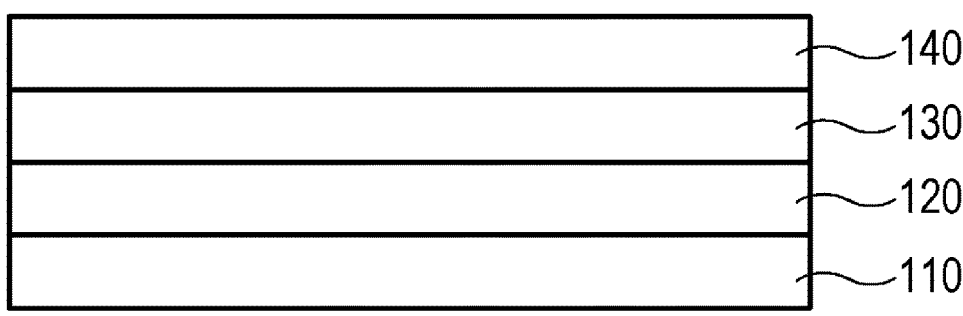
FIG. 1 is a cross-sectional view showing a III-N semiconductor structure according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. Descriptions which are not necessary to understand exemplary embodiments will be omitted in order to clearly explain the exemplary embodiments in the drawings, and like or relevant components are indicated by like reference numerals throughout the drawings.

Throughout the disclosure herein, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used herein means that one or more other components, steps, operation and/or existence or addition of elements are not excluded in addition to the described components, steps, operation and/or elements unless context dictates otherwise.

FIG. 1 is a cross-sectional view of a III-N semiconductor structure 100 according to an embodiment.

Referring to FIG. 1, a III-N semiconductor structure 100 includes a substrate 110, a seed layer 120 on the substrate 110, a superlattice structure layer 130 on the seed layer 120, and a cap layer 140 on the superlattice structure layer 130.

The substrate 110 generally has the (111) crystal orientation or may have a different crystal orientation. The substrate 110 may be a silicon carbide substrate, a silicon substrate, or an SOI (Silicon on Insulator) substrate. The SOI substrate may range in thickness from about 450 to 2,000 µm.

The seed layer 120 is provided on the substrate 110. The seed layer 120 is to grow the superlattice structure layer 130, which is used as a buffer layer, and can supply a crystal lattice structure that becomes a seed for the superlattice structure layer 130. The seed layer 120 may include a III-N material such as aluminum nitride (AlN), etc.

The superlattice structure layer 130 is provided on the seed layer 120. In order to compensate for the thermal tensile stress generated during the cooling of the wafer after growth of the III-N semiconductor structure, the superlattice structure layer 130 may provide compression resistant stress. The superlattice structure layer 130, shown in FIG. 2, which is formed by depositing a plurality of superlattice units 135, may be effective for implementing compression resistant stress and filtering dislocations in the growth surface.

Figure 2:
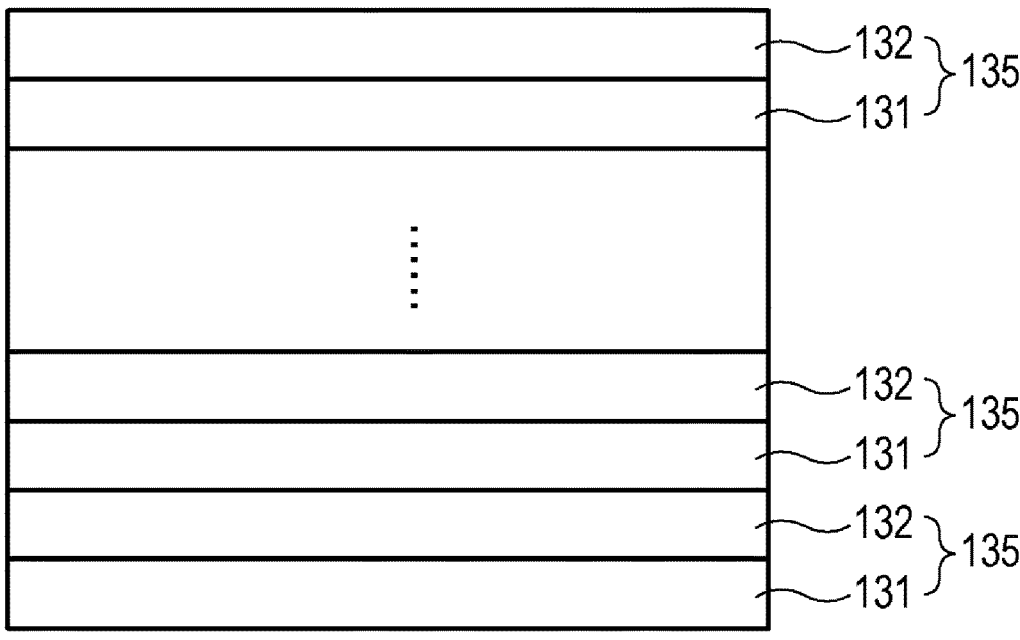
FIG. 2 is a cross-sectional view showing a superlattice structure layer of a III-N semiconductor structure according to an embodiment.

FIG. 2 is a cross-sectional view of the superlattice structure layer 130 of the III-N semiconductor structure 100 according to an embodiment. With reference to FIG. 2, the superlattice structure layer 130 includes alternating layers (first layers 131 and second layers 132) of materials different in lattice constant from each other, with the couple of a first layer 131 and a second layer 132 accounting for a superlattice unit 135. In the superlattice structure layer 130, the plurality of alternating first layers 131 and second layers 132 may provide compressive stress and tensile stress in an alternating manner.

The first layer 131 and the second layer 132 have respective lattice constants. One of the lattice constants is larger than the other. For example, the first layer 131 may have a larger lattice constant than that of the second layer 132, or the second layer 132 may have a larger lattice constant than that of the first layer 131.

Figure 4:
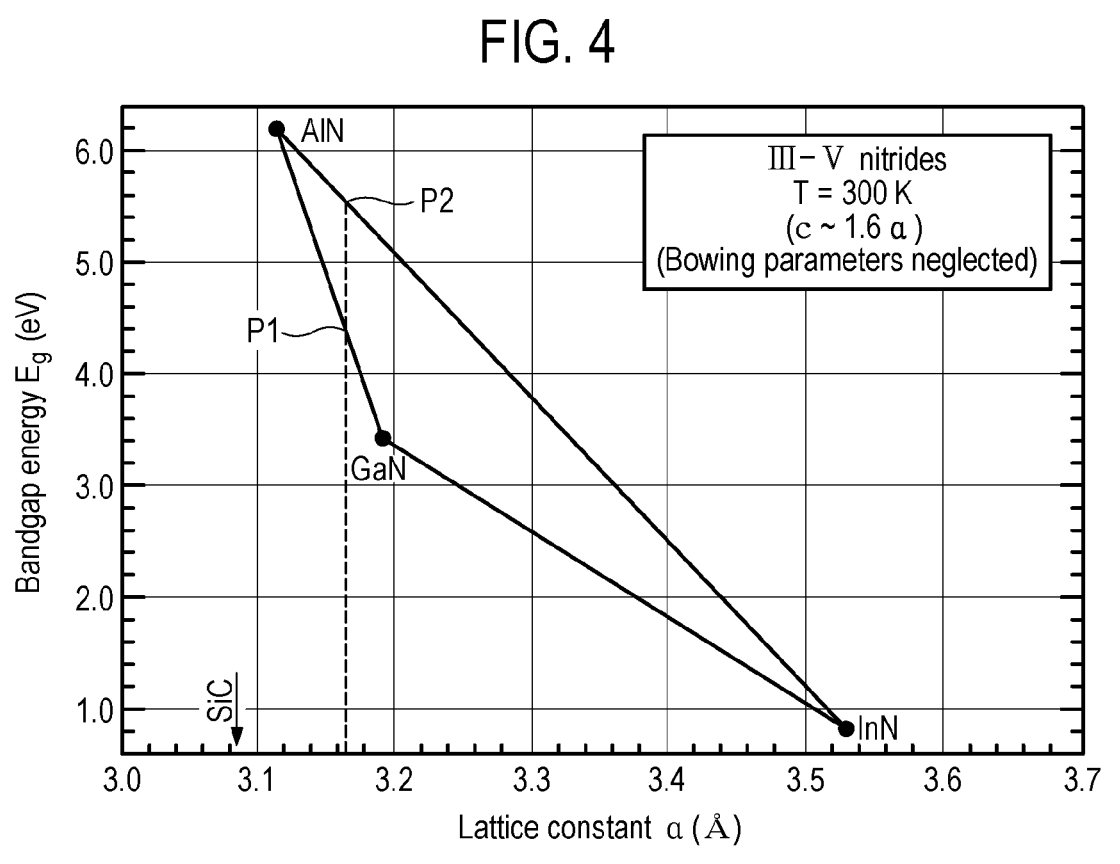

Referring to FIG. 4, which depicts correlation between lattice constant and band gap in III-N semiconductor materials, the lattice constant of the seed layer 120 including aluminum nitride (AlN) is smaller than that of the cap layer 140 including gallium nitride (GaN). In addition, the average lattice constant of the superlattice structure layer 130 formed by the plurality of superlattice units 135 may be between the lattice constants of the seed layer 120 and the cap layer 140.

A compressive stress is formed when the superlattice structure layer 130 has an average lattice constant that is larger than the lattice constant of the see layer 120, which is a lower layer, and smaller than the lattice constant of the cap layer 140, which is an upper layer. The compressive stress continues to increase as the cap layer 140 having a larger lattice constant than that of the superlattice structure layer 130 is grown on the superlattice structure layer 130. The compressive stress can offset the tensile stress generated by a difference in thermal expansion coefficient when the temperature is cooled to room temperature after completion of the growth of the cap layer 140, whereby the bending or cracking of the III-N semiconductor structure 100 can be controlled.

The first layer 131 in the superlattice unit 135 may include a $Al_xGa_{1-x}N$ $(0 \leq x \leq 1)$ material and the second layer 132 may include an $In_yAl_{1-y}N$ $(0 < y \leq 0.4)$ material. The average lattice constant of the superlattice structure layer 130 can be controllably set between the lattice constants of the seed layer 120 and the cap layer 140 by suitably adjusting the composition of the $Al_xGa_{1-x}N$ $(0 \leq x \leq 1)$ material accounting for the first layer 131, the composition of the $In_yAl_{1-y}N$ $(0 < y \leq 0.4)$ material accounting for the second layer 132, and the thicknesses of the first layer 131 and the second layer 132.

The superlattice structure layer 130 may be larger in bandgap energy than the cap layer 140 that includes a gallium nitride (GaN) material, thereby acquiring an insulation property in the III-N semiconductor structure 100.

With reference to FIG. 4, the superlattice structure layer 130 composed of AlGaN and InAlN materials may have a bandgap energy higher than that of a superlattice structure layer composed only of Al, Ga, and N.

Specifically, at the positions of compositions (P1, P2) in which lattice constants of the first layer 131 including a AlGaN material and the second layer 132 including an InAlN material are between those of the AlN material (seed layer) and the GaN material (cap layer), the average lattice constant of the superlattice structure layer 130 formed of the first layers 131 and the second layers 132 that are deposited in an alternating manner is the same as the lattice constant in the P1 and P2 compositions. In addition, the bandgap energy of the superlattice structure layer 130 is positioned between the bandgap energies at positions P1 and P2.

The superlattice structure layer composed only of Al, Ga, and N has the bandgap energy at position P2, which is smaller than that of the superlattice structure layer 130 composed of AlGaN and InAlN materials.

Because the continuity of lattice constants should be taken into account when the average lattice constant of the superlattice structure layer 130 is to be set in light of the lattice constant difference between the lower seed layer 120 and the upper cap layer 140, if the upper cap layer 140 contains a gallium nitride (GaN) material, the average lattice constant of the superlattice structure layer 130 cannot but approach near the lattice constant of gallium nitride. As is understood in FIG. 4, the approach of the average lattice constant of the superlattice structure layer to the lattice constant of gallium nitride should decrease the bandgap energy of the superlattice structure layer, with the consequent decrease of insulation properties. However, the superlattice structure layer 130 composed of AlGaN and InAlN materials according to an embodiment of the present disclosure is higher in bandgap energy than the superlattice structure layer composed only of Al, Ga, and N and, as such, can secure insulation properties in the III-N semiconductor structure.

The superlattice structure layer 130 may include 50 to 400 superlattice units 135. Each of the superlattice units 135 may be 3 nm to 30 nm thick. In the superlattice unit 135, the first layer 131 and the second layer 132 may have the same thickness. According to another embodiment, the first layer 131 may be different in thickness from the second layer 132.

In the superlattice unit 135, one layer may be at least 2, 3, or 4 fold thicker than the other layer. The thickness ratio between the first layer 131 and the second layer 132 may be all combinations ranging from 1:10 to 10:1.

Turning again to FIG. 1, the cap layer 140 is provided on the superlattice structure layer 130 and includes a III-N material. As described above, the cap layer 140 may include a gallium nitride material and may be larger in lattice constant and smaller in bandgap energy than the superlattice structure layer 130.

The layers in the III-N semiconductor structure 100 can be grown by molecular beam epitaxy (MBE) or metal organic chemical vapor deposition (MOCVD).

Figure 3:
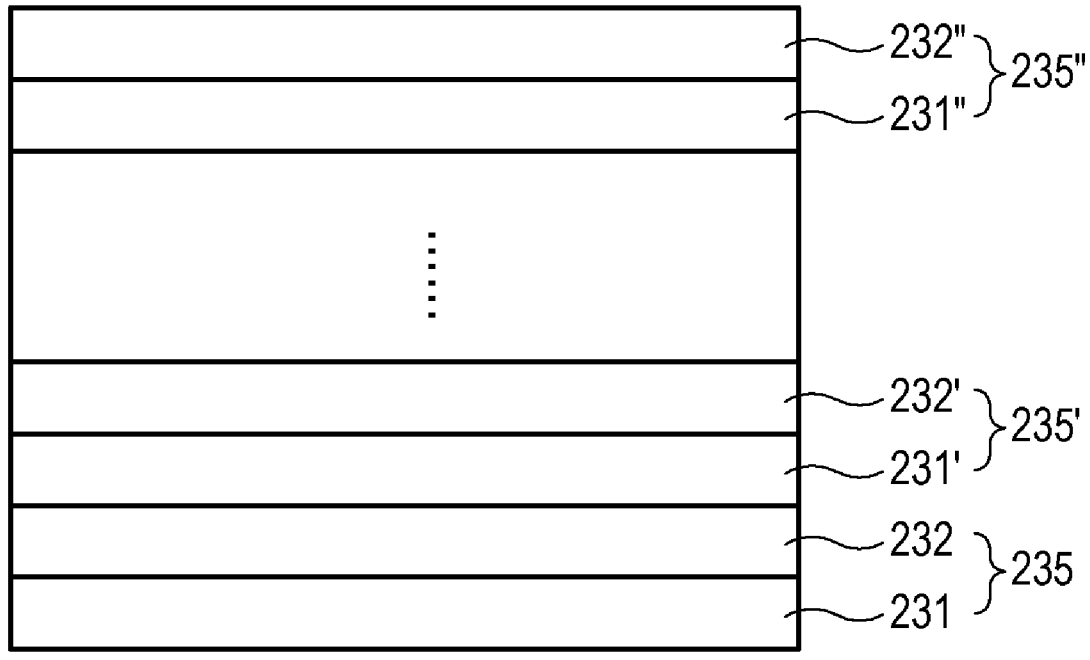
FIG. 3 is a cross-sectional view showing a superlattice structure layer of a III-N semiconductor structure according to another embodiment.

FIG. 3 is a cross-sectional view of a superlattice structure layer 230 in a III-N semiconductor structure according to another embodiment. The superlattice structure layer 230 is formed on the seed layer 120 of FIG. 1 and is an alternative to the superlattice structure layer 130 stated above. The superlattice structure layer 230 has the same configuration as the superlattice structure layer 130, except for the configuration described below.

Referring to FIG. 3, the average lattice constant of the superlattice structure layer 230 may be controlled to have a value between the lattice constant of the seed layer 120 and the lattice constant of the cap layer 140. In addition, the superlattice structure layer 230 includes a plurality of superlattice units 235, 235', and 235" and may be configured so that a superlattice unit deposited farther from the seed layer 120 has a larger lattice constant than that of a superlattice unit deposited nearer to the seed layer 120. For example, a larger lattice constant is given to the superlattice unit 235' than the superlattice unit 235 and to the superlattice unit 235" than the superlattice unit 235'.

The superlattice units 235, 235', and 235" include first layers 231, 231', and 231" and second layers 232, 232', and 232", respectively. The first layers 231, 231', and 231" may each include an $Al_xGa_{1-x}N$ ($0 \le x \le 1$) material and the second layers 232, 232', and 232" may each include an $In_yAl_{1-y}N$ ($0 < y \le 0.4$) material. By appropriately adjusting material compositions and thicknesses of the first layers 231, 231', and 231" and the second layers 232, 232', and 232", the superlattice units 235, 235', and 235" can be controlled to have higher lattice constant values for the superlattice units farther away from the seed layer 120, that is, lattice constant values nearer to that of the cap layer 140 including a gallium nitride (GaN) material.

In addition, the superlattice units in the superlattice structure layer 230 can be controlled to have lattice constants increasing stepwise according to a specific period as they are positioned far away from the seed layer 120. For example, whenever 50 superlattice units are deposited over the seed layer 120, lattice constants of 50 superlattice units subsequently deposited may be controlled to increase over those of 50 superlattice units previously deposited.

Therefore, the superlattice structure layer 230 formed according to an embodiment of the present disclosure may increase in lattice constant in the direction from the seed layer 120 to the cap layer 140, with the average lattice constant thereof positioned between the lattice constant of the seed layer 120 and the lattice constant of the cap layer 140.

In the structure described above, the change of lattice constant may decrease as the layers go from the seed layer 120 to the superlattice structure layer 230 and further to the cap layer 140, with the consequent increased continuity of lattice constants across the structure. Therefore, when the epitaxial growth of the III-N semiconductor structure is completed, bending or cracking can be further prevented from occurring.

As described hitherto, the III-N semiconductor structure and the manufacturing method therefor according to an embodiment of the present disclosure employ AlGaN and InAlN materials in the superlattice structure layer serving as a buffer layer when the semiconductor structure is constructed by epitaxially growing a III-N material on a silicon substrate, whereby the epitaxial structure can be prevented from being bent or cracked upon completion of the growth thereof.

In addition, serving as a buffer layer, the superlattice structure layer including AlGaN and InAlN materials can maintain a high bandgap, which leads to an improvement in the insulation properties of the III-N semiconductor structure.

While the III-N semiconductor structure and the manufacturing method therefor have been described with reference to the embodiments shown in the drawings, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures

What is claimed is:

1. A III-N semiconductor structure comprising:

a substrate including a silicon material;

a seed layer formed on the substrate and including an aluminum nitride (AlN) material;

a superlattice structure layer formed by sequentially depositing a plurality of superlattice units on the seed layer; and a cap layer formed on the superlattice structure layer and including a gallium nitride (GaN) material, wherein the plurality of superlattice units are each composed of a first layer consisting essentially of an $Al_xGa_{1-x}N$ wherein $0 \leq x \leq 1$ and a second layer consisting essentially of an $In_yAl_{1-y}N$ wherein $0 < y \leq 0.4$, wherein the superlattice structure layer has an average lattice constant between a lattice constant of the seed layer and a lattice constant of the cap layer, wherein the superlattice structure layer is larger in bandgap energy than the cap layer, wherein the superlattice structure layer is higher in bandgap energy than a superlattice structure layer composed only of Al, Ga, and N, wherein the superlattice structure layer comprises 50 to 400 superlattice units, and wherein the plurality of superlattice units sequentially deposited on the seed layer have lattice constants that increase in value as the plurality of superlattice units are located farther from the seed layer by adjusting the x value of $Al_xGa_{1-x}N$ of the first layer and the y value of $In_yAl_{1-y}N$ of the second layer.

2. The III-N semiconductor structure of claim 1, wherein the superlattice units each have a thickness of 30 nm or less.

3. The III-N semiconductor structure of claim 1, wherein a thickness ratio of the second layer to the first layer in the superlattice unit ranges from 1:10 to 10:1.

4. The III-N semiconductor structure of claim 1, wherein the seed layer, the superlattice structure layer, and the cap layer are grown by molecular beam epitaxy (MBE) or metal organic chemical vapor deposition (MOCVD).

5. A method for manufacturing a III-N semiconductor structure, the method comprising the steps of:

preparing a substrate including a silicon material;

forming a seed layer including an aluminum nitride (AlN) material on the substrate;

forming a superlattice structure layer in which a plurality of superlattice units are sequentially deposited on the seed layer; and growing a gallium nitride (GaN) material on the superlattice structure layer to form a cap layer, wherein the plurality of superlattice units are each composed of a first layer consisting essentially of an $Al_xGa_{1-x}N$ wherein $0 \leq x \leq 1$ and a second layer consisting essentially of an $In_yAl_{1-y}N$ wherein $0 < y \leq 0.4$, wherein the step of forming the superlattice structure layer is conducted so that superlattice structure layer is controlled to have an average lattice constant between a lattice constant of the seed layer and a lattice constant of the cap layer, wherein the step of forming the superlattice structure layer is conducted so that superlattice structure layer is controlled to have a bandgap energy larger than that of the cap layer, and the superlattice structure layer is higher in bandgap energy than the superlattice structure layer composed only of Al, Ga, and N, wherein the step of forming the superlattice structure layer is conducted so that the superlattice structure layer is controlled to comprise 50 to 400 superlattice units, and wherein the step of forming the superlattice structure layer is conducted so that a superlattice unit deposited on the seed layer farther from the seed layer is controlled to have a larger lattice constant by adjusting the x value of $Al_xGa_{1-x}N$ of the first layer and the y value of $In_yAl_{1-y}N$ of the second layer.

6. The method of claim 5, wherein the step of forming the superlattice structure layer is conducted so as to make each of the superlattice units 30 nm or less in thickness.

7. The method of claim 5, wherein the step of forming the superlattice structure layer is conducted so that a thickness ratio of the second layer to the first layer in the superlattice unit ranges from 1:10 to 10:1.

8. The method of claim 5, wherein the seed layer, the superlattice structure layer, and the cap layer are grown by molecular beam epitaxy (MBE) or metal organic chemical vapor deposition (MOCVD).

* * * * *